United States Patent [19]
Fujii

[11] Patent Number: 5,132,722
[45] Date of Patent: Jul. 21, 1992

[54] IMAGING RECORDING APPARATUS CAPABLE OF FORMING A FRAME-LIKE MARGINAL PORTION IN OUTER PERIPHERY OF AN IMAGE PORTION

[75] Inventor: Eiji Fujii, Gifu, Japan

[73] Assignee: Brother Kogyo Kabushiki Kaisha, Aichi, Japan

[21] Appl. No.: 759,946

[22] Filed: Sep. 17, 1991

Related U.S. Application Data

[63] Continuation of Ser. No. 500,411, Mar. 28, 1990, abandoned.

[30] Foreign Application Priority Data

Mar. 28, 1989 [JP] Japan .................................. 1-75583

[51] Int. Cl.⁵ .............................................. G03B 27/32
[52] U.S. Cl. ......................................... 355/27; 355/37; 355/55; 355/70
[58] Field of Search ........................ 355/27, 28, 32, 37, 355/55, 56, 60, 70, 74, 243; 430/138

[56] References Cited

U.S. PATENT DOCUMENTS

| | | |
|---|---|---|
| 4,496,983 | 1/1985 | Takenaka . |
| 4,692,797 | 9/1987 | Matsumoto . |
| 4,772,941 | 9/1988 | Noble . |
| 4,860,058 | 8/1989 | Kobayashi et al. ............... 355/77 X |
| 4,896,183 | 1/1990 | Ohashi et al. .......................... 355/27 |
| 4,899,227 | 2/1990 | Yamada . |

*Primary Examiner*—L. T. Hix
*Assistant Examiner*—Khanh Dang
*Attorney, Agent, or Firm*—Oliff & Berridge

[57] ABSTRACT

An image recording apparatus for recording an image of an original document on a photosensitive, pressure-sensitive recording medium by exposing the recording medium to imaging light to form a latent image thereon and pressure developing the latent image. The size of the latent image to be formed on the recording medium is detected and a color of a marginal portion surrounding the image portion is specified through an operation unit. An LED array is arranged upstream of an exposure station and in a direction to transverse the recording medium for irradiating light onto the marginal portion of the recording medium so that the marginal portion is reproduced with the color as specified.

10 Claims, 4 Drawing Sheets

IMAGING RECORDING APPARATUS CAPABLE OF FORMING A FRAME-LIKE MARGINAL PORTION IN OUTER PERIPHERY OF AN IMAGE PORTION

This is a continuation of application Ser. No. 07/500,411 filed Mar. 28, 1990, now abandoned.

BACKGROUND OF THE INVENTION

The present invention relates generally to an image recording apparatus using a photosensitive recording medium.

Image recording apparatuses, such as photographic developing device, microfilm reader printer, record images on a photosensitive recording medium in such a way that light is irradiated onto an original, the recording medium is exposed to light which has passed through or reflected from an original to form a latent image, and the latent image is developed to provide a visible image on the recording medium.

In the recording apparatuses capable of arbitrarily setting a magnification of an image to be formed on the recording medium, the recording medium may be formed with a blank, frame-like marginal portion in the outer periphery of the recording medium. This is due to the fact that the exposure area changes depending upon the magnification as set. The user may want to cut off the blank portion and to attach the image portion onto a separate board or sheet. In this instance, if the image portion is roughly cut out of the recording medium, the image portion attached to the board is not visually acceptable, since the image portion may overly cut out or white edge would remain in the outer periphery of the image portion if the color of the board is not white despite the color of the recording medium is white. Therefore, it is necessary that the image portion be precisely and accurately cut out of the recording medium. It has been desired that such a cutting procedure be easily performed, since it is troublesome and time-consuming.

SUMMARY OF THE INVENTION

The present invention has been made to solve the above-mentioned problem, and accordingly it is an object of the present invention to provide an image recording apparatus in which cutting of marginal blank portion of the image is facilitated by coloring a surrounding region of the image with a specified color.

To achieve the above and other objects of the present invention, there is provided an image recording apparatus for recording an image of an original document on a photosensitive recording medium, comprising exposure means for exposing the photosensitive recording medium to imaging light to form a latent image corresponding to the image of the original document, the latent image having a size defined by an upper line, a lower line, a right side line and a left side line, the photosensitive recording medium having a marginal portion surrounding the latent image, developing means for developing the latent image formed on the photosensitive recording medium, detection means for detecting the size of the latent image to be formed by the exposure means, color specifying means for specifying a color of the marginal portion, and irradiation means for irradiating light onto the marginal portion depending upon the size of the latent image detected by the detection means and for presenting the color in the marginal portion in accordance with the color specified by the color specifying means.

Magnification setting means is further provided for setting a magnification of the image to be recorded on the photosensitive recording medium with respect to the image of the original document, wherein the size of the latent image changes depending upon the magnification set by the magnification setting means and the size of the latent image detected by the detection means is determined in accordance with the magnification set by the magnification setting means. Conveying means is provided which conveys an elongated, web-like photosensitive recording medium past the exposure means, the photosensitive recording medium having a predetermined width, wherein the irradiation means comprises a plurality of light emitting diodes arranged in a widthwise direction of the photosensitive recording medium.

In accordance with the present invention thus arranged, even if the size of the latent image changes depending upon the magnification set by the magnification setting means, the marginal portion surrounding the image portion can be reproduced with the color specified. Therefore, when it is intended to cut the image portion out of the recording medium and attach it to a separate board having the same color as the marginal portion, the image portion may be cut relatively roughly, since no visual inconsistency is caused.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

Figure 2:
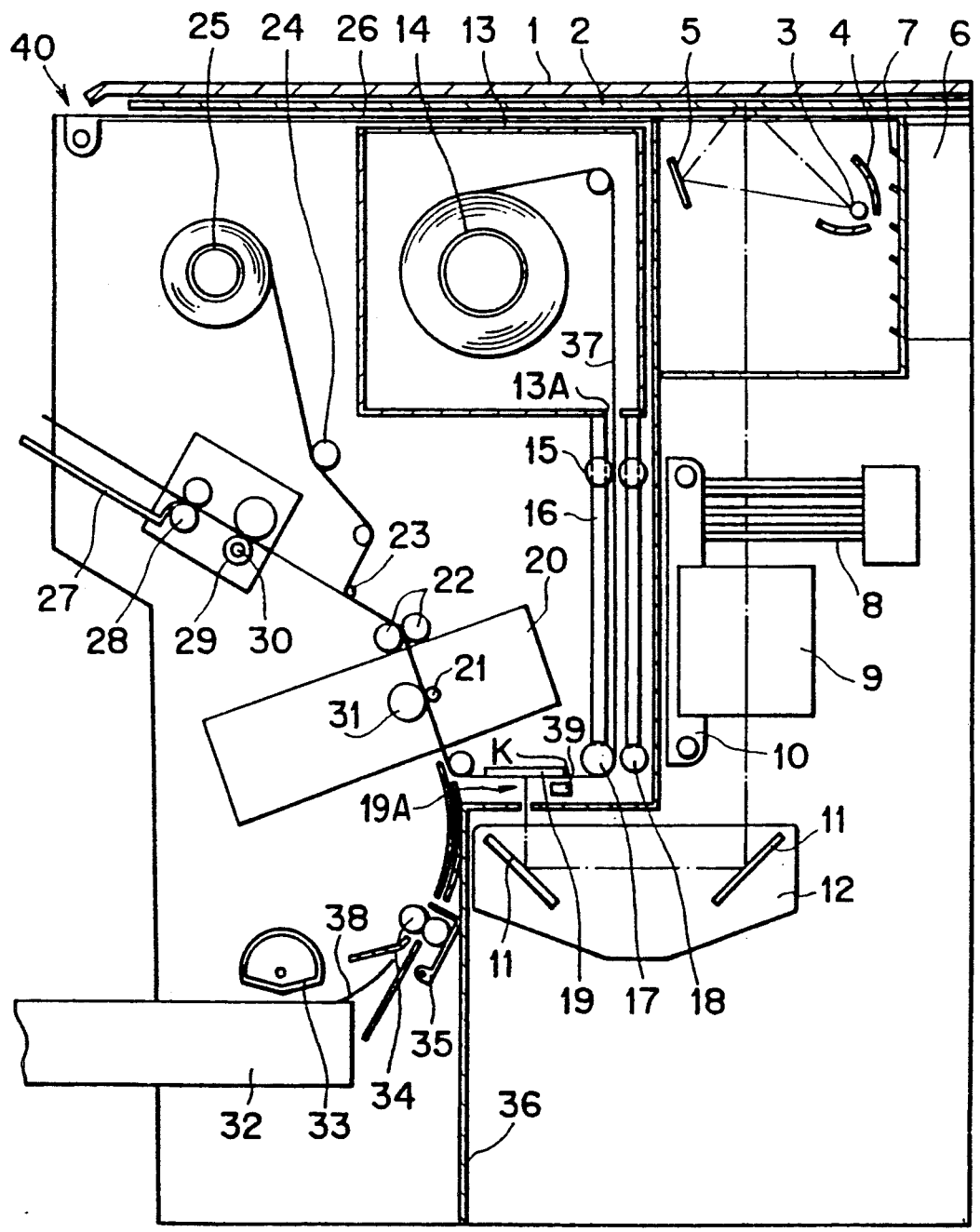
FIG. 2 is a vertical cross-sectional view showing an image recording apparatus according to the present invention.

FIG. 2 shows an image recording apparatus 40 capable of performing a full-color recording or copying. In this apparatus, a microcapsule sheet as disclosed in U.S. Pat. No. 4,399,209 to Sanders et al is used. Briefly, the microcapsule sheet is coated with an immense number of microcapsules on one surface thereof. The microcapsule encapsulates photo-curing (or photo-softening) resin and a chromogenic material of one of three primary colors, i.e. cyan, magenta and yellow. In image reproduction, a separate image receiving sheet referred generally to as developer sheet is used in combination with the microcapsule sheet, which has a surface coated with a developer material. When the microcapsule sheet is exposed to an imaging light, the mechanical strength of the exposed microcapsules is changed from soft to hard or vice versa to thereby form a latent image thereon. The microcapsule sheet formed with the latent image and the developer sheet are superposed one on the other, and the latent image is developed under pressure and a visible image is reproduced on the developer sheet by rupturing the microcapsules of weaker mechanical strength and having the chromogenic material released therefrom react with the developer material.

Referring to FIG. 2, a light shielding partition plate 36 is disposed in the apparatus 40 to spacedly divide the apparatus 40 into two chambers. That is, a light source unit and an optical system are disposed within one chamber whereas other requisite units, such as a pressure developing and thermal fixing stations, are disposed within the other chamber.

An elongated web-like microcapsule sheet 37 wound around a cartridge shaft 14 is retained in a microcapsule sheet cartridge 13 that is detachably disposed at a position immediately below an original support pane 2 and is formed with a bottom opening 13A. An exposure station 19 is disposed below the sheet cartridge 13 at a downstream side thereof. The sheet 37 passes through a number of rollers and the pressure developing station 20, and a leading end of the sheet 37 is attached to a take-up shaft 25 positioned beside the sheet cartridge 13. Between the sheet cartridge 13 and the exposure station 19, feed roller 15 and a guide roller 17 are rotatably provided at a vertical sheet path for guide travel of the sheet toward the exposure station 19. At the downstream of the exposure Line 19A, there is provided the pressure developing station 20 which includes first and second pressurizing rollers 21, 31.

At a lower portion of the apparatus 40, there is provided a developer sheet cassette 32 for storing therein a stack of developer sheets 38. Immediately above the cassette 32, a sector roller 33 is rotatably provided for feeding the uppermost developer sheet 38 toward the pressure developing station 20.

Between the cassette 32 and the pressure developing station 20, a pair of feed rollers 34 and a registration gate 35 are provided. The registration gate 35 and the feed rollers 34 perform alignment of the leading edge of the developer sheet 38 and thereafter feed the developer sheet 38 toward the pressure developing station 20.

Next, an optical system and optical path in the apparatus 40 will be described. As shown, the apparatus 40 has its top plate portion provided with a cover member 1 and the original support pane 2. The original support pane 2 is formed of a light transmissive material and is movable in the horizontal direction and on which an original document (not shown) is placed face down. At the upper right side of the apparatus 40, fixedly provided is a halogen lamp 3 extending in the direction perpendicular to the sheet of drawing, and a semi-cylindrically shaped reflector 4 is disposed to surround the lamp 3. The halogen lamp 3 emits a light toward the original support pane 2.

Therefore, the light emitted from the halogen lamp 3 can be sequentially irradiated onto the entire surface over the region from one to the other end of the original support pane 2 as the original support pane 2 moves horizontally. The light from halogen lamp 3 passes through the transparent original support pane 2 and is reflected from the original placed thereon. The cover member 1 is provided to prevent this light from leaking out of the apparatus. To irradiate the light from the halogen lamp 3 onto the original at a high efficiency, a flat reflector 5 is disposed to face the halogen lamp 3 and receive the light from the lamp 3 and direct it toward the original document. At the rear side of the halogen lamp 3, there are provided a fan 6 and a louver 7 for introducing an external air into the apparatus, with which air is effectively impinged upon the lamp 3 to cool the same.

A filter unit 8 having a plurality of filter elements is disposed below the original support pane 2. Further, a lens unit 9 is provided below the filter unit 8. Light emitted from the halogen lamp 3 and reflected from the original document passes through the filter elements 8 and enters the lens unit 9. The filter elements alter the light transmissive characteristic in accordance with the sensitivity characteristics of the microcapsule sheet 37, to thereby adjust the color tone of a copied output image. The lens 9 is fixedly secured to a lens mounting plate 10, and fine angular adjustment of this lens with respect to a light path is achievable. The lens unit 9 is capable of being vertically moved by a lens moving device (not shown) so that a copying magnification is changed.

A pair of reflection mirrors 11 are provided below lens 9. The light focused by the lens unit 9 is changed its direction by 180 degrees (completely reverse direction) by the two reflection mirrors 11, and is applied onto the microcapsule sheet 37 closely contacting the bottom of an exposure table 19 to form the latent image thereon. The two reflection mirrors 11 are securely mounted to a mirror mounting plate 12. The mirror mounting plate 12 is vertically movably provided so that the adjustment of the distance of the light path and focusing adjustment can be effected by fine adjustment of the position of the mirror mounting plate 12. The original, the filer 8, the lens 9, the pair of reflection mirrors 11 and the exposure table 19 define a U-shape or J-shape light path in combination. That is, the optical path is bent into U-shape or J-shape, which path comprises a first vertical path directed downwardly, a second path directed horizontally and a third path directed upwardly. At the first optical path, the light reflected from the original is oriented downwardly, and at the third path the light is directed toward the imaging surface of the microcapsule sheet 37 at the exposure zone 19A, and the reflection mirror unit (11, 12) is disposed at the second optical path extending in horizontal direction. When the mirror mounting plate 12 is downwardly moved by a certain distance, the total light path distance is increased by a distance twice as long as the moving distance of the plate 12, yet maintaining the focusing position on the exposure zone 19A unchanged.

The mirror mounting plate 12 can maintain relative angular positional relationship between the pair of mirrors 11 regardless of the vertical movement of the plate 12. Accordingly, the plate 12 fixedly mounting the two mirrors can be simply assembled to the recording apparatus 40 as those can be treated as a single integral unit. It should be noted that only the pair of reflection mirrors 11 are required to obtain a normal upstanding or erect imaging direction at the exposure zone 19A, since the light is finally applied to the exposure zone upwardly, i.e, the microcapsule sheet 37 is exposed to light at the exposure zone 19A with the microcapsule coated surface facing down.

An LED array 39 is disposed rightwardly of the exposure table 19 and arranged in the direction orthogonal to the direction in which the microcapsule sheet 37 is conveyed so that the entire width of the microcapsule sheet 37 is covered by the LED array 39. The LED array 39 serving as an irradiating means and a light emitting means includes a plurality of red LEDs which are tightly and straightly arranged. Each LED is of the size about 0.2 mm². These LEDs are selectively turned on by an LED controlling unit 39a to be described later.

At downstream of the pressure developing station 20, a pair of feed rollers 22 are provided for transporting the microcapsule sheet 37 at a preselected constant speed. More specifically, the feed rollers 22 are rotated by a motor (not shown), and the number of rotations of the motor is changed in accordance with the horizontally moving speed of the original support pane 2 and the copying magnification. When copying is made at equi-magnification, the transporting speed of the microcapsule sheet 37 is controlled to be in coincidence with the moving speed of the original support pane 2.

At downstream of the feed rollers 22, a sheet separation mechanism including a separation roller 23 is provided at which the microcapsule sheet 37 is separated from the developer sheet 38. The separated microcapsule sheet 37 is taken-up by the take-up shaft 25 through a meander travel control roller 24. On the other hand, a thermal fixing station 30 is provided at the downstream of the separation roller 23. The thermal fixing station 30 includes a hollow heat roller 29, in the interior of which a heater element 30A is disposed. Further, a pair of feed rollers 28 are provided to feed the image fixed developer sheet 38 toward a discharge tray 27.

Operation of the apparatus 40 arranged as above will be described.

The microcapsule sheet 37 drawn out from the opening 13A of the cartridge 13 is fed by the feed rollers 15 and guided by the barrel roller 17. The sheet 37 then passes while contacting the lower face of the exposure table 19 where imaging light is applied to the sheet 37, so that a latent image is formed on the sheet 37.

More specifically, the cover member 1 is lifted up for placing the original document on the original support pane 2. Then, when a start button (not shown) is depressed, the original support pane 2 is moved to one direction (rightwardly in FIG. 2), so that one side edge of the pane 2 (left side edge in FIG. 2) stops at a first position where the one side edge of the pane 2 is coming into confrontation with the light source. Thereafter, with the halogen lamp 3 being lit, the original support pane 2 is then moved in a second direction (leftwardly in FIG. 2) opposite the first direction. The light emitted from the halogen lamp 3 is reflected from the original, and the light reflected therefrom passes through the filter 8 and lens 9 and is reflected at the two reflection mirrors 11. The last reflected light is finally directed toward the microcapsule sheet 37 which is located under the exposure table 19, thereby forming a latent image on the sheet 37. The microcapsule sheet 37 is moved under the exposure table 19 in the second direction (leftwardly in FIG. 2) at a predetermined speed relative to the moving speed of the original support pane 2. The moving speed of the microcapsule sheet 37 is determined depending upon the copying magnitude. In the case of equi-magnitude copying, the microcapsule sheet 37 is moved at the same speed as the moving speed of the original support pane 2 whereby the latent image having the same size as the original image is formed on the microcapsule sheet 37. Since the conveying speed of the microcapsule sheet 37 is controlled to be constant by the feed rollers 22 and is set at a given ratio to the moving speed of the original support pane 2 depending upon a copying magnification, line latent images having given widths are sequentially formed on the microcapsule sheet 37 that is passing along the lower surface of the exposure table 19.

The sheet 37 is then fed to the pressure developing station 20. At the pressure developing station 20, the sheet 37 and the developer sheet 38 are held in facial contact with each other and are applied with pressure to develop the latent image and form a visible image on the developer sheet 38. The microcapsule sheet 37 leaving from the cartridge 13 is kept unexposed to light due to the presence of a shielding cover 16. The developer sheets 38 are fed out one by one by the sector roller 33, and each sheet 38 is fed to a sheet inlet of the pressure developing station 20 after the leading edge of the sheet 38 is aligned by the feed rollers 34 and the registration gate 35.

The microcapsule coated surface of the sheet 37 on which a latent image is formed contacts the developer coated surface of the developer sheet 38 inside the pressure developing station 20, and these superposed sheets are pressed together by the pressurizing rollers 21, 31. Unexposed microcapsules are ruptured by the pressure applied, to thereby form an output image on the developer sheet 38 due to the reaction of the chromogenic material released from the ruptured microcapsules with the developer material.

In summary, in timed relation with the movement of the original support pane 2 in the second direction, the sector roller 33 feeds out the developer sheets 38 one by one from the developer sheet cassette 32. The developer sheet 37 is brought to facial contact with the exposed microcapsule sheet 37 and both sheets are fed to the pressure developing station 20 in which the latent image on the microcapsule sheet 37 is developed and transferred onto the developer sheet 38.

The microcapsule sheet 37 and developer sheet 38 leaving from the pressure developing station 20 are fed out by the feed rollers 22 and are separated by the separation roller 23, the former sheet 37 directing upward and the latter sheet 38 directing in the straight direction. Thereafter, the developer sheet 38 is subjected to thermal fixing in the thermal fixing station 30 and is then discharged onto the discharge tray 27 face up. The microcapsule sheet 37 leaving from the pressure developing station 20 and passing through the separation roller 23 and the meandering control roller 24 is wound around the take-up shaft 25. When the movement of the original support pane 2 is stopped at a second position where another edge (right side in FIG. 2) of the pane 2 confronts the light source, the scanning of the original document is completed and the halogen lamp 3 is turned off.

Figure 3:
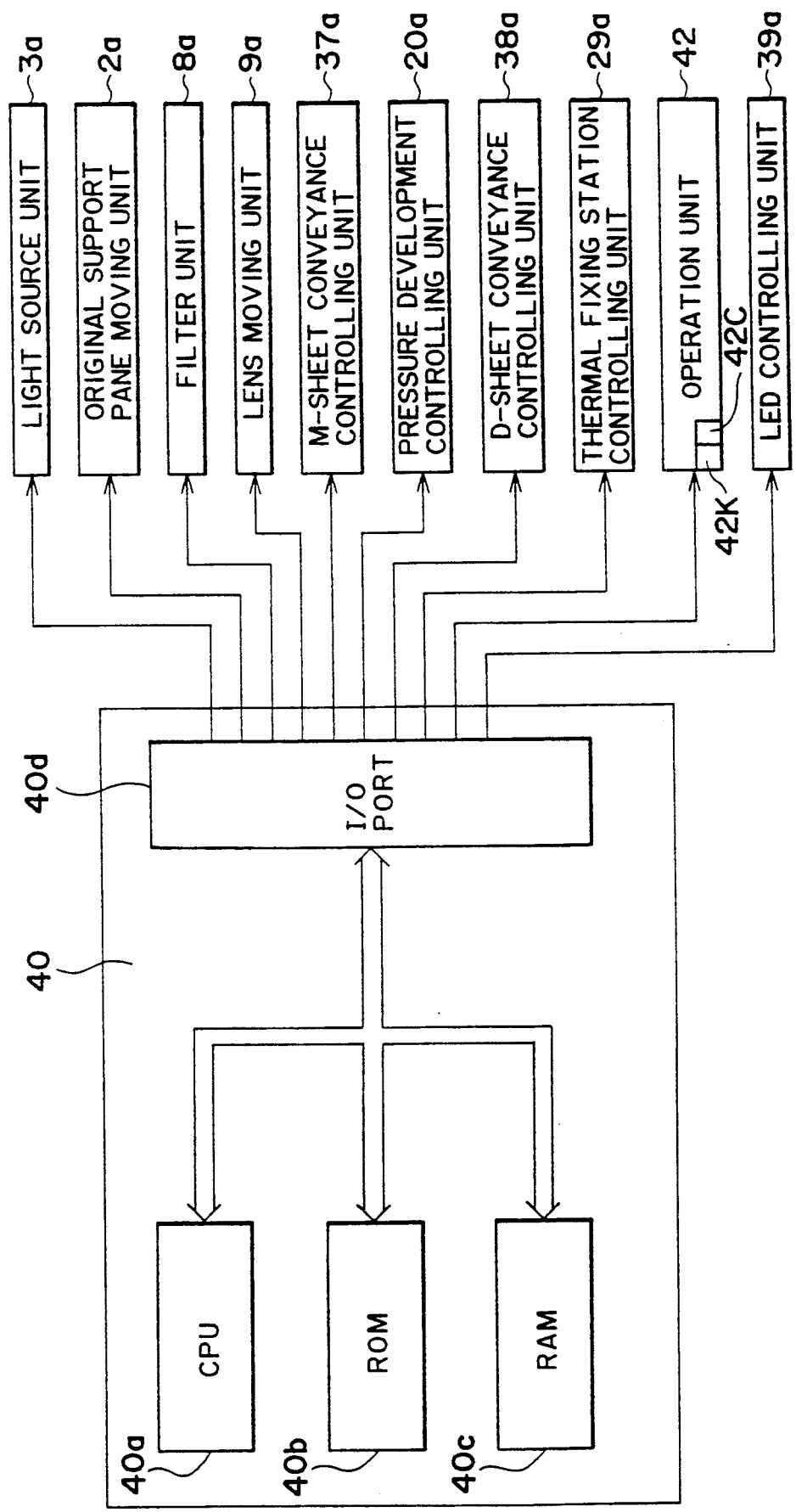
FIG. 3 is a block diagram showing an electrical circuit incorporated in the image recording apparatus according to the present invention.

An electrical circuit incorporated in the apparatus will next be described with reference to FIG. 3.

A control circuit 40 essentially comprised of a central processing unit (CPU) 40a, a read-only memory (ROM) 40b and a random access memory (RAM) 40c is connected through an input/output port 40d to a light source unit 3a for controlling an amount of light emitted from the halogen lamp 3, an original support pane moving unit 2a for reciprocally moving the original support pane 2, a filter unit 8a for controlling an amount of insertion or retraction of the filter 8 into or out of the optical path, a lens moving unit 9a for moving the lens 9 along the optical path in accordance with the magnification, a microcapsule sheet conveyance controlling unit 37a for conveying the microcapsule sheet 37 in synchronism with the movement of the original support pane 2 or stopping the conveyance of the microcapsule sheet 37, a pressure development controlling unit 20a for rotating the small-diameter roller 21 provided in the pressure developing station 20 at a predetermined speed and for bringing the small-diameter roller and the back-up roller 31 into and out of contact with each other, a developer sheet conveyance controlling unit 38a for conveying the developer sheet 38 toward the pressure developing station 20 by rotating both the sector roller 33 and the feed rollers 34 and for advancing the registration gate 35 into or retracting the same from the conveying path of the developer sheet 38, a thermal fixing station controlling unit 29a for controlling an amount of heat generation by the heat roller provided interior of the thermal fixing station, an operation unit 42 including a magnification setting key 42K for setting a magnification of the image to be reproduced on the microcapsule sheet 37 and a color specifying key 42C for specifying a color of the marginal zone which surrounds the reproduced image, and the LED controlling unit 39a for exposing the on-image area on the microcapsule sheet 37 to light using the LED array 39 and for causing the marginal zone to be developed with a specified color. In this embodiment, the color specifying key 42C is for specifying a red color. The control circuit 40 thus arranged carries out a series of reproducing operations including a magnification control for moving the lens in accordance with the magnification set through the operation unit 42 and conveyance and exposure of the microcapsule sheet 37 in accordance with a copying start instruction fed through the operation unit 42.

Figure 1:
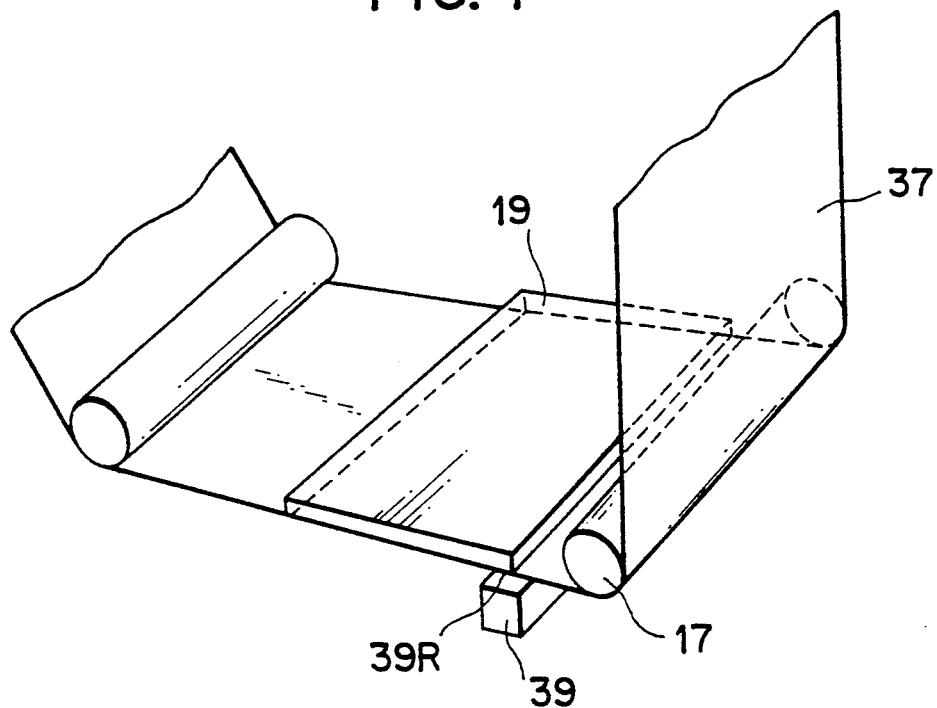
FIG. 1 is a perspective view showing a position of an LED array with respect to an exposure station and a photosensitive recording medium.

As shown in FIG. 1, the LED array 39 is disposed upstream side or rightwardly of the exposure table 19 and beneath the microcapsule sheet 37 while facing the latter. To the LED array 39, the control circuit 40 is connected through the LED controlling unit 39a. In accordance with the exposure magnification outputted from the magnification setting key 42K and the specified color outputted from the color specifying key 42C, the CPU 40a of the control circuit 40 determines which LEDs should be turned on or off. Concurrently with the start of the exposure, the relevant LEDs are turned on so that the image surrounding region on the microcapsule sheet 37 which region remains unexposed by the imaging light is irradiated with the light emitted from the LEDs and developed with a color being specified.

Figure 4:
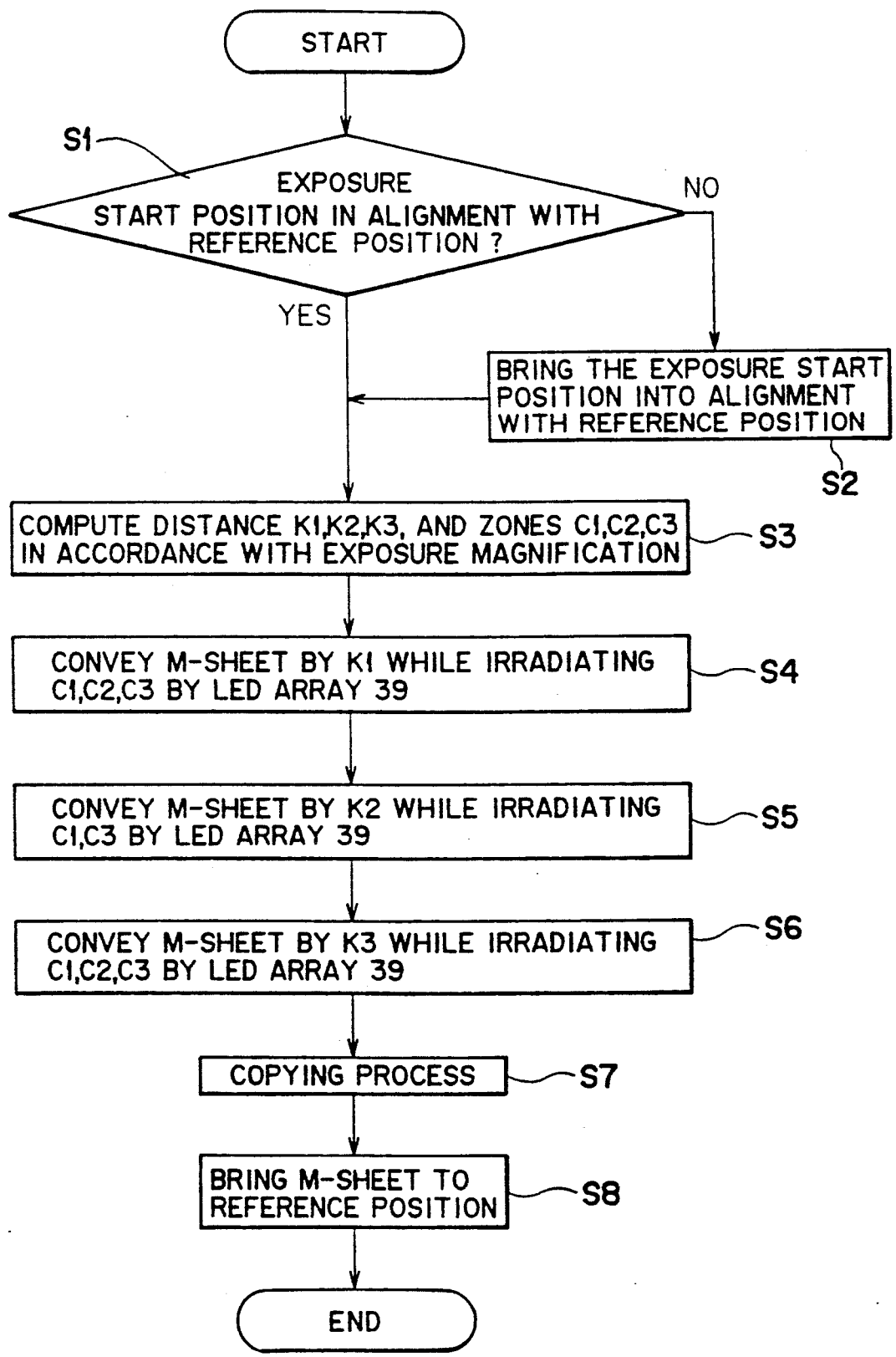
FIG. 4 is a flow chart for description of the operation of the present invention.

An image forming process including determining means for determining the size of the latent image to be formed by the exposure means will be described while referring to the flow chart FIG. 4.

Figure 5:
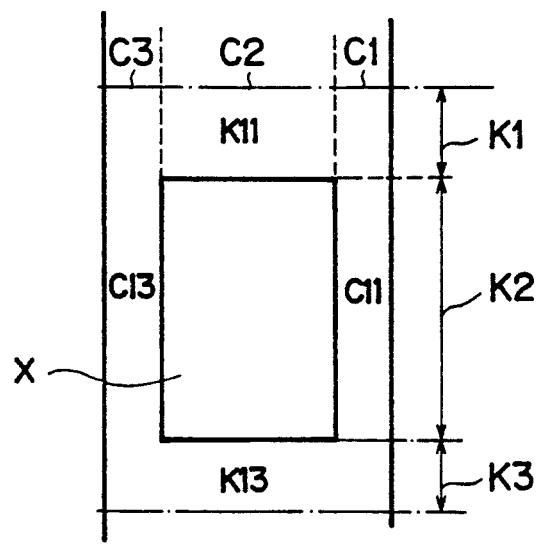
FIG. 5 is a plan view showing an image portion and a marginal portion to be formed on the image recording medium.

When the signals from the magnification setting key 42K and the color specifying key 42C of the operation unit 42 are inputted, the CPU 40a checks whether or not the leading edge or an unused position of the microcapsule sheet 37 (this edge or position will hereinafter be referred to as "exposure start position") is in alignment with a reference position K (see FIG. 2) in step 1. If the CPU 40a determines that the exposure start position of the microcapsule sheet 37 is not in alignment with the reference position K, it drives a motor (not shown) provided in the microcapsule sheet conveyance controlling unit 37a so that the exposure start position of the microcapsule sheet 37 is brought to the reference position K (step 2). In this manner, when the exposure start position of the microcapsule sheet 37 is brought to the reference position K or when decision is made so that the exposure start position is in the reference position K, the CPU 40a computes a conveying distance K1 of the microcapsule sheet 37. This distance K1 corresponds to a top margin to be exposed by the LED array 39 prior to the exposure by the imaging light. The CPU 40a further computes a conveying distance K2 of the microcapsule sheet 37 corresponding to the length of the image region where the image is formed by the imaging light, and a conveying distance K3 corresponding to a bottom margin to be exposed by the LED array 39 after the exposure by the imaging light. Furthermore, the CPU 40a computes a widthwise image forming zone C2 of the microcapsule sheet 37 to be exposed by the imaging light, a right margin zone C1 of the microcapsule sheet rightwardly of the zone C2, and a left margin zone C3 leftwardly of the zone C2 (step 3). Determination of the size of the latent image to be formed by the exposure means is determined by execution of step 3. The irradiation area or the exposure area on the microcapsule sheet 37 to be irradiated by the imaging light changes depending upon the copying magnification and further the exposure start position by the imaging light also changes depending thereupon. In step 3, the conveying distance K1 is computed depending upon the exposure magnification so that the exposure by the imaging light is taken place in the central portion X of the microcapsule sheet 37 as shown in FIG. 5. Further, by the computation of the conveying distances K2 and K3 in accordance with the exposure magnification, the top margin K11 corresponding to the conveying distance K1, the bottom margin K13 corresponding to the conveying distance K3 and the side margins C11 and C13 corresponding respectively to C1 and C3, all of which define the central portion X, are exposed to light by the LED array 39. It should be noted that turning on and off of the LEDs are determined by the conveying distances of the microcapsule sheet 37. Based upon the above computation, the CPU 40a conveys the microcapsule sheet 37 by the distance K1 while irradiating the zones C1, C2 and C3 of the microcapsule sheet 37 (step 4). Based upon the computation in step 3, the CPU 40a further conveys the microcapsule sheet 37 while exposing the zone C2 to light emitted from the light source 3. At this time, the zones C1 and C3 are being irradiated by the light emitted from the LED array 39 (step 5). Based upon the computation in step S3, the CPU 40a further conveys the microcapsule sheet 37 by the distance K3 (step 6) while irradiating the zones C1, C2 and C3 with the LED array 39.

Upon completion of the copying process in step 7, the CPU 40a aligns the exposure start position of the microcapsule sheet 37 with the reference position (step 8), whereby the latent image corresponding to the image of the original document is formed in the central portion of the microcapsule sheet 37 and red latent images are formed in the top margin K11, the bottom margin K13 and the side margins C11 and C13. After completion of the copying process, visible image corresponding to the latent image thus formed is provided on the developer sheet 38. In this case, a red margin is formed in the outer periphery of the reproduced image. Therefore, even if the marginal portions of the developer sheet are roughly cut out for attaching the image portion to a red color board or base sheet, the resultant image board is not visually unpleasant.

In the above-described embodiment, although a halogen lamp has been used as a light source for exposing the microcapsule sheet, a semiconductor laser may be used in lieu thereof, with which the microcapsule sheet can be directly exposed. In addition, it would be apparent for those skilled in the art that various modifications and changes may be made without departing from the scope and spirit of the present invention. For example, a photosensitive, pressure-sensitive recording medium of a so-called self-contained type as disclosed in Japanese Laid-Open Patent Publication No. 58-88740 is also available. Other types of photosensitive recording media are also available. Furthermore, a light source other than the red LEDs may be used to differently color the marginal portion. In addition, multi-LED arrays may be used so that a desired color can be specified among a plurality of colors.

What is claimed is:

1. An image recording apparatus for recording an image of an original document on a photosensitive recording medium, comprising:

exposure means for exposing the photosensitive recording medium to imaging light to form a latent image corresponding to the image of the original document, the latent image having a size defined by an upper line, a lower line, a right side line and a left side line, the photosensitive recording medium having a marginal portion surrounding the latent image;

developing means for developing the latent image formed on the photosensitive recording medium;

determining means for checking and computing the size of the latent image to be formed by said exposure means;

color specifying means for specifying a color of the marginal portion; and irradiation means for irradiating light onto the marginal portion depending upon the size of the latent image determined by said determining means and for presenting the color in the marginal portion in accordance with the color specified by said color specifying means.

2. An image recording apparatus according to claim 1, further comprising magnification setting means for setting a magnification of the image to be recorded on the photosensitive recording medium with respect to the image of the original document, and wherein the size of the latent image changes depending upon the magnification set by said magnification setting means.

3. An image recording apparatus according to claim 2, wherein the size of the latent image determined detected by said determining means is determined in accordance with the magnification set by said magnification setting means.

4. An image recording apparatus according to claim 1, further comprising conveying means for conveying the photosensitive recording medium past said exposure means, the photosensitive recording medium having a predetermined width, and wherein said irradiation means comprises a plurality of light emitting diodes arranged in a widthwise direction of the photosensitive recording medium.

5. An image recording apparatus according to claim 4, wherein said light emitting means is disposed adjacent said exposure means.

6. An image recording apparatus according to claim 1, wherein the photosensitive recording medium comprises a photosensitive sheet having a surface coated with an immense number of microcapsules each encapsulating a resin and a chromogenic material, and an image receiving sheet having a surface coated with a developer material, a mechanical strength of the resin being changed when exposed to light, and wherein said developing means comprises pressure applying means for applying a pressure to the photosensitive sheet to rupture the microcapsules of weaker mechanical strength and having the chromogenic material released from the ruptured microcapsules react with the developer material to thereby record the image on the image receiving sheet.

7. An image recording apparatus according to claim 6, further comprising magnification setting means for setting a magnification of the image to be recorded on the image receiving sheet with respect to the image of the original document, and wherein the size of the latent image changes depending upon the magnification set by said magnification setting means.

8. An image recording apparatus according to claim 7, wherein the size of the latent image determined by said detection means is determined in accordance with the magnification set by said magnification setting means.

9. An image recording apparatus according to claim 8, further comprising conveying means for conveying the photosensitive sheet past said exposure means, the photosensitive recording medium having a predetermined width, and wherein said irradiation means comprises a plurality of light emitting diodes arranged in a widthwise direction of the photosensitive sheet.

10. An image recording apparatus according to claim 9, wherein said light emitting means is disposed adjacent said exposure means.

* * * * *